US006446317B1

(12) United States Patent
Figueroa et al.

(10) Patent No.: US 6,446,317 B1
(45) Date of Patent: Sep. 10, 2002

(54) HYBRID CAPACITOR AND METHOD OF FABRICATION THEREFOR

(75) Inventors: David G. Figueroa, Mesa; Yuan-Liang Li, Chandler; Huong T. Do, Scottsdale, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/540,705

(22) Filed: Mar. 31, 2000

(51) Int. Cl.[7] .................................................. H01G 7/00

(52) U.S. Cl. ................ 29/25.42; 360/306.1; 360/306.2; 360/306.3; 427/79

(58) Field of Search .................... 29/25.42; 427/79–81; 360/306.1, 306.2, 306.3

(56) References Cited

U.S. PATENT DOCUMENTS 5,937,493 A * 8/1999 Nellissen .................. 29/25.42

* cited by examiner

*Primary Examiner*—Carl J. Arbes

(74) *Attorney, Agent, or Firm*—Schwegman, Lundberg, Woessner & Kluth P.A.

(57) ABSTRACT

A hybrid capacitor associated with an integrated circuit package provides multiple levels of excess, off-chip capacitance to die loads. The hybrid capacitor includes a low inductance, parallel plate capacitor embedded within the package, and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

16 Claims, 11 Drawing Sheets

516
514
514
502
506
504
507
505
508
510
516
5B
5B
508
512
516
510

HYBRID CAPACITOR AND METHOD OF FABRICATION THEREFOR

TECHNICAL FIELD OF THE INVENTION

The present invention relates generally to apparatus for providing capacitance to a microelectronic circuit, and more particularly to capacitors used in conjunction with a parallel plate capacitor to provide capacitance to a microelectronic circuit, apparatus utilizing such capacitors, and methods of their fabrication.

BACKGROUND OF THE INVENTION

Electronic circuits, and particularly computer and instrumentation circuits, have in recent years become increasingly powerful and fast. As circuit frequencies delve into the gigahertz (GHz) region, with their associated high frequency transients, noise in the DC power and ground lines increasingly becomes a problem. This noise can arise due to inductive and capacitive parasitics, for example, as is well known. To reduce such noise, capacitors known as decoupling capacitors are often used to provide a stable signal or stable supply of power to the circuitry.

Capacitors are further utilized to dampen power overshoot when an electronic device, such as a processor, is powered up, and to dampen power droop when the electronic device begins using power. For example, a processor that begins performing a calculation may rapidly need more current than can be supplied by the on-chip capacitance. In order to provide such capacitance and to dampen the power droop associated with the increased load, off-chip capacitance should be available to respond to the current need within a sufficient amount of time. If insufficient current is available to the processor, or if the response time of the capacitance is too slow, the die voltage may collapse.

Decoupling capacitors and capacitors for dampening power overshoot or droop are generally placed as close to the load as practical to increase the capacitors' effectiveness. Often, these capacitors are surface mounted to the electronic device or the package substrate on which the device is mounted. At increasingly reduced device sizes and packing densities, however, available real estate for surface-mounted capacitors becomes a limiting factor.

One solution has involved the formation of a parallel plate capacitor integrated on or embedded within a substrate. FIG. 1 illustrates a parallel plate capacitor 102 in accordance with the prior art. Capacitor 102 includes two planar conductors 104. When separated by a non-conducting material (not shown), a charge can be stored across the capacitor 102.

FIG. 2 illustrates a cross section of an embedded parallel plate capacitor coupled to a die 204 in accordance with the prior art. The embedded capacitor includes two planar conductors 206, 208 that are separated by a thin dielectric layer 210 (e.g., 1 micron or less). The dielectric material used in layer 210 must have a high dielectric constant in order to provide the amount of capacitance needed. To have a capacitance large enough for the decoupling of CPUs, this dielectric constant has a value in the thousands (e.g., within a range of 2000 to 5000) or many layers must be stacked. Desirably, the planar conductors 206, 208 are located below the die 204, in order to be close to any die load that may require capacitance, or to effectively reduce noise in the DC power and ground lines supplied to the die.

One of the two planar conductors 206 or 208 is connected, via conductive paths 212, to ground terminals of one or more die loads (not shown). The other planar conductor 208 or 206 is connected, via conductive paths 212, to power terminals of the one or more die loads. These planar conductors 206, 208, coupled with the thin dielectric layer 210, provide capacitance for noise, power overshoot, and power droop dampening, as modeled by capacitor 216.

FIG. 3 illustrates an electrical circuit that simulates the electrical characteristics of the parallel plate capacitor illustrated in FIG. 2. The circuit shows a die load 302, which may require capacitance or noise dampening in order to function properly. Some of the capacitance can be supplied by capacitance 304 located on the die. Other capacitance, however, must be provided off chip, as indicated by off-chip capacitor 306. The off-chip capacitor 306 could be, for example, the embedded parallel plate capacitor illustrated in FIG. 2. The off-chip capacitor 306 may more accurately be modeled as a capacitor in series with some resistance and inductance. For ease of illustration, however, off-chip capacitance 306 is modeled as a simple capacitor.

Naturally, the off-chip capacitor 306 would be located some distance, however small, from the die load 302, due to manufacturing constraints. Accordingly, some inductance 308 exists between the die load and the off-chip capacitance. Because the inductance 308 tends to slow the response time of the off-chip capacitor 306, it is desirable to minimize the distance between the off-chip capacitance 306 and the die load 302, thus reducing the inductance value 308. This can be achieved by placing the off-chip capacitor 306 as close as possible to the die load.

In order to increase the amount of capacitance supplied by the parallel plate capacitor, the surface area of the plates can be increased. Increasing the surface area, however, increases the risk of shorts or leakage between the plates, thus reducing yield and increasing reliability concerns.

Besides reliability concerns, the parallel plate capacitor solution may not be sufficient for many higher frequency applications. This is because the parallel plate capacitance is spread out over a large area, resulting in large lateral parasitics that may prevent the timely flow of charge to "hot spots" on the die (i.e., localized portions of the die that require large amounts of current in short periods of time). In addition, the propagation of the charge is a strong function of not only inductance, but also capacitance. Therefore, the lateral parasitics and relatively high capacitance characteristic of an embedded parallel plate capacitor may unacceptably slow the charge response time to the die hot spots, resulting in a collapse of the die voltage supply.

As electronic devices continue to advance, there is an increasing need for higher levels of capacitance at reduced inductance levels for decoupling, power dampening, and supplying charge. Accordingly, there is a need in the art for alternative capacitance solutions in the a fabrication and operation of electronic and integrated circuit devices.

DETAILED DESCRIPTION OF THE INVENTION

Figure 1:
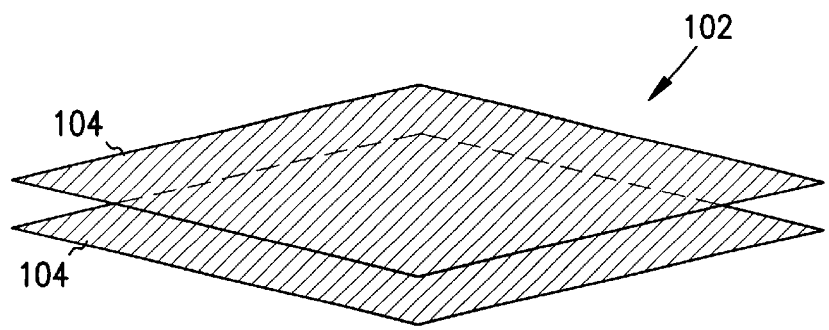
FIG. 1 illustrates a parallel plate capacitor in accordance with the prior art.
Figure 2:
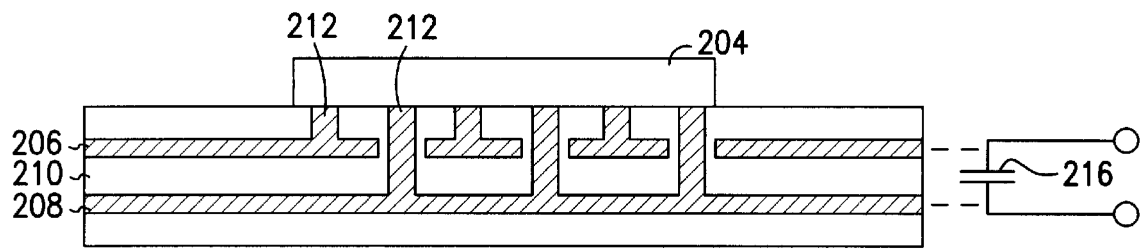
FIG. 2 illustrates a cross section of an embedded parallel plate capacitor coupled to a die in accordance with the prior art.
Figure 3:
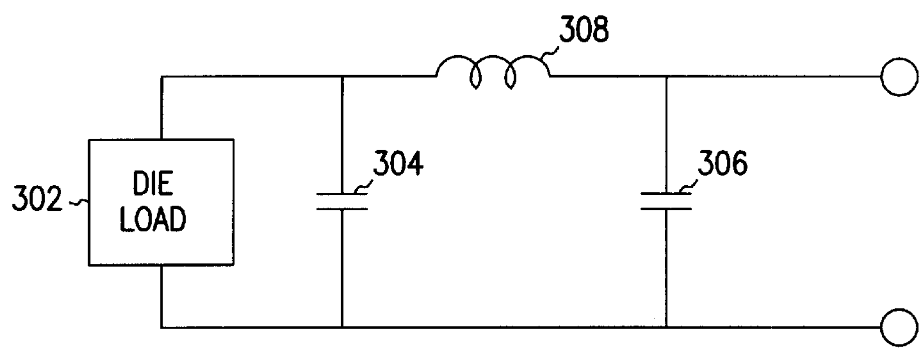
FIG. 3 illustrates an electrical circuit that simulates the electrical characteristics of the parallel plate capacitor illustrated in FIG. 2.

Various embodiments of the present invention provide a low-inductance, hybrid capacitor structure that effectively suppresses noise, dampens power overshoot and droop, and supplies charge to die hot spots in a timely manner. In one embodiment, the capacitor structure is implemented in and on a device package, and includes an embedded parallel plate capacitor to which an additional high dielectric parallel plate capacitor, discrete capacitors, and self-aligned, coaxial via capacitors are electrically connected. In other embodiments, the embedded parallel plate capacitor is used in conjunction with either the high dielectric parallel plate capacitor, the discrete capacitors, the self-aligned capacitors or some combination of those capacitors, but not all. Either way, the parallel plate capacitor is a first off-chip capacitor that acts as a first source of capacitance, and the high dielectric parallel plate, self-aligned, and/or discrete capacitors are a second set of capacitors that act as a second source of capacitance.

The parallel plate capacitor has a very thin dielectric layer with a relatively low dielectric constant, thus providing an extremely low inductance path between the self-aligned and/or discrete capacitors. In addition, the parallel plate capacitor provides some charge, when needed. Unlike the parallel plate capacitor just mentioned, the additional high dielectric parallel plate capacitor has a relatively high dielectric constant, thus providing more charge, when needed. In order to avoid confusion in the description below, the low dielectric parallel plate capacitor is referred to as the "low inductance" capacitor, while the high dielectric parallel plate capacitor is referred to as the "high dielectric" capacitor.

Microelectronic device packages commonly include multiple interconnect levels. In such a package, patterned conductive material on one interconnect level is electrically insulated from patterned conductive material on another interconnect level by dielectric material layers. Connections between the conductive material at the various interconnect levels are made by forming openings, referred to as vias, in the insulating layers and providing an electrically conductive structure such that the patterned conductive material from different interconnect levels are brought into electrical contact with each other. These structures can extend through one or more of the interconnect levels, and are often referred to as contacts or interconnect structures.

In one embodiment of the present invention, the generic via structure is modified in order to convert the via into a small capacitor that is similar in its electrical characteristics to a coaxial capacitor. The modified via structure is referred to herein as a self-aligned via capacitor, or self-aligned capacitor. In one embodiment, a set of these self-aligned capacitors are electrically connected to an embedded low inductance capacitor in order to provide a low inductance path between the self-aligned capacitors and a die.

Figure 4:
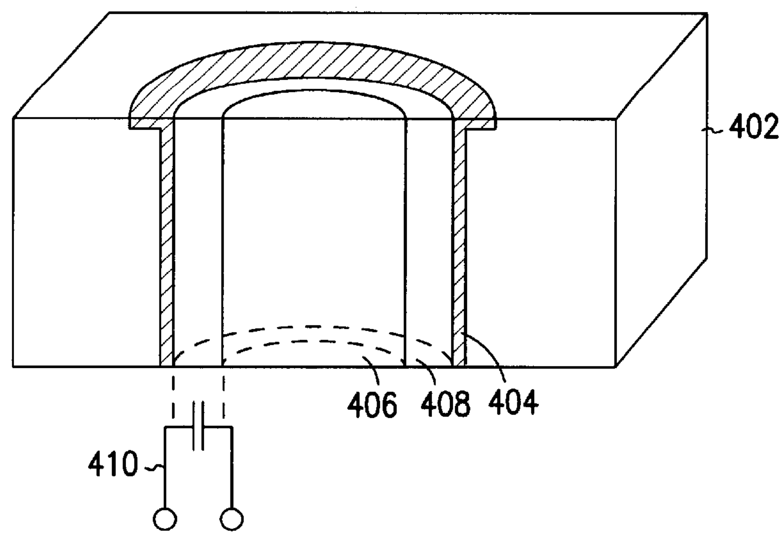
FIG. 4 illustrates a three-dimensional cross-section of a self-aligned via capacitor in accordance with one embodiment of the present invention.

FIG. 4 illustrates a three-dimensional cross-section of a self-aligned via capacitor in accordance with one embodiment of the present invention. The self-aligned capacitor is disposed through one or more layers of a substrate 402.

Similar to a coaxial capacitor, the self-aligned capacitor includes an outer conductor 404 and an inner conductor 406. The outer and inner conductors 404, 406 are electrically isolated from each other by a dielectric material 408 disposed between the conductors. Because the outer and inner conductors 404, 406 are separated by a non-conducting material 408, a charge can be stored across the conductors, as modeled by capacitor 410.

By electrically connecting the outer and inner conductors 404, 406 to opposite terminals of various die loads, a number of the package vias are converted into coaxial capacitors. In some cases, however, these capacitor structures may be characterized by an unacceptable level of inductance due to the relatively large area that separates the self-aligned capacitors. This high inductance to the self-aligned capacitance may render most of this off-chip capacitance unavailable to the die hot spots.

Consequently, in one embodiment, a set of coaxial capacitors is combined with an embedded low inductance capacitor, which effectively reduces the inductance to the self-aligned capacitance, and also provides capacitance of its own. In this embodiment, an additional level of capacitance is supplied by discrete capacitors and a high dielectric capacitor, which are also coupled to the low inductance capacitor. This hybrid capacitor structure is connected to the die loads, thus providing multiple levels of off-chip capacitance.

Figure 5A:
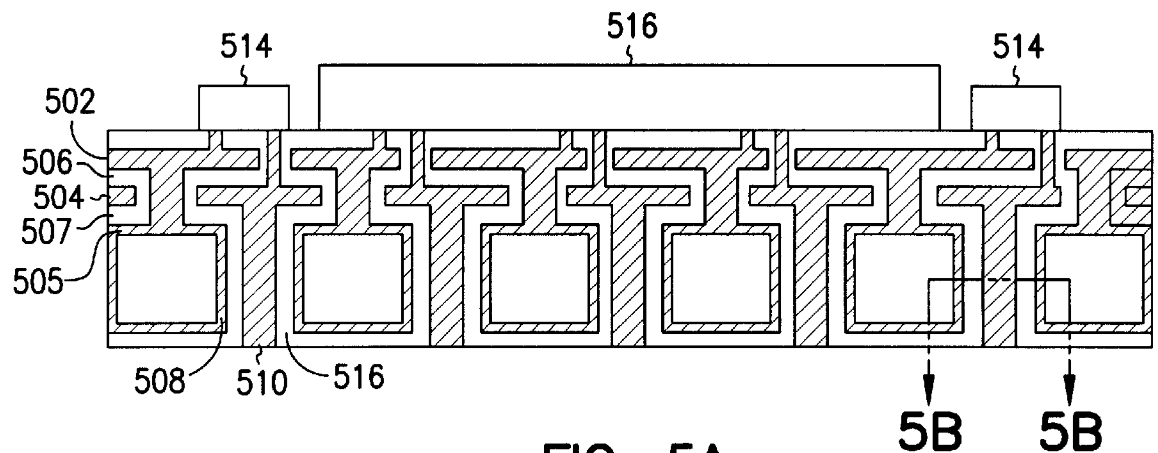
FIG. 5 illustrates a cross-section of a hybrid capacitor that includes a low inductance capacitor, a high dielectric capacitor, a set of self-aligned via capacitors, and at least one discrete capacitor in accordance with one embodiment of the present invention.
Figure 5B:
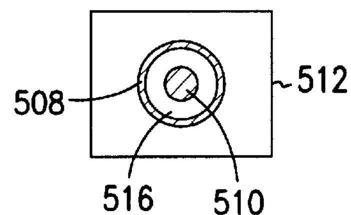

FIG. 5 illustrates a cross-section of a hybrid capacitor that includes a low inductance capacitor, a high dielectric capacitor, a set of self-aligned via capacitors, and at least one discrete capacitor in accordance with one embodiment of the present invention. The low inductance capacitor includes a top conductive layer 502 and a bottom conductive layer 504, separated by a thin dielectric layer 506. The high dielectric capacitor includes a top conductive layer 504 and a bottom conductive layer 505, also separated by a thin dielectric layer 507. In one embodiment, the dielectric layer 506 of the low inductance capacitor has a relatively low dielectric constant (e.g., in a range of about 1 to 1000), and the dielectric layer 507 of the high dielectric capacitor has a relatively high dielectric constant (e.g., in a range of about 1000 to 5000 or more). In this manner, the low inductance capacitor provides a low inductance path between any additional capacitance and a die load, but supplies relatively little charge to that load. In contrast, the high dielectric capacitor provides relatively more charge to that load. In alternate embodiments, the high dielectric capacitor may be situated above the low inductance capacitor, in which case dielectric layers 506 and 507 would be switched.

Each self-aligned capacitor includes an outer conductor 508, an inner conductor 510, and a dielectric layer 516, as illustrated by the horizontal cross-section 512 of one self-aligned capacitor along section lines A—A. In the embodiment shown, the outer conductor 508 is electrically connected to the bottom conductive layer 505 of the high dielectric capacitor. In an alternate embodiment, the bottom conductive layer 505 may be an additional conductive plane within the package, which may or may not be electrically connected to outer conductor 508.

When the top conductive layer 502 serves as the power plane, the bottom conductive layer 504 serves as the ground plane, and vice versa. In this manner, a charge is stored across the layers 502, 504, and this charge is also stored across the high dielectric, self-aligned, and discrete capacitors by virtue of their electrical connections to the conductive layers 502, 504.

The top conductive layer 502 of the low inductance capacitor is shown to be electrically connected to the bottom conductive plane 505 of the high inductance capacitor, to the outer conductors 508 of the self-aligned capacitors, and also to the one or more discrete capacitors 514. The bottom conductive layer 504 is shown to be electrically connected to the inner conductors 510 of the self-aligned capacitors, and also to the one or more discrete capacitors 514. In another embodiment, the top conductive layer 502 could connect to the inner conductors 510, and the bottom conductive layer 504 could connect to the outer conductors 508. Like the low inductance, high dielectric, and self-aligned capacitors, each discrete capacitor 514 includes a first conductor and a second conductor separated by a dielectric material (not shown). Each of these conductors are electrically connected to one of the conductive layers 502, 504 of the low inductance capacitor.

In one embodiment, at least a portion of the low inductance capacitor is disposed underneath the die 516, along with the high dielectric capacitor and the set of self-aligned capacitors. The self-aligned capacitors may be dispersed evenly underneath the die and low inductance capacitor, or concentrations of self-aligned capacitors could be provided to produce additional capacitance for the die hot spots. FIG. 5 illustrates only five self-aligned capacitors being dispersed underneath the die 516. In practice, many more self-aligned capacitors would be dispersed underneath the die in order to provide sufficient capacitance. In addition, the relative dimensions of the parallel plate, discrete, and self-aligned capacitor components are for illustration purposes only. In reality, these dimensions would likely be very different from those shown in FIG. 5, as will be described below.

Figure 6:
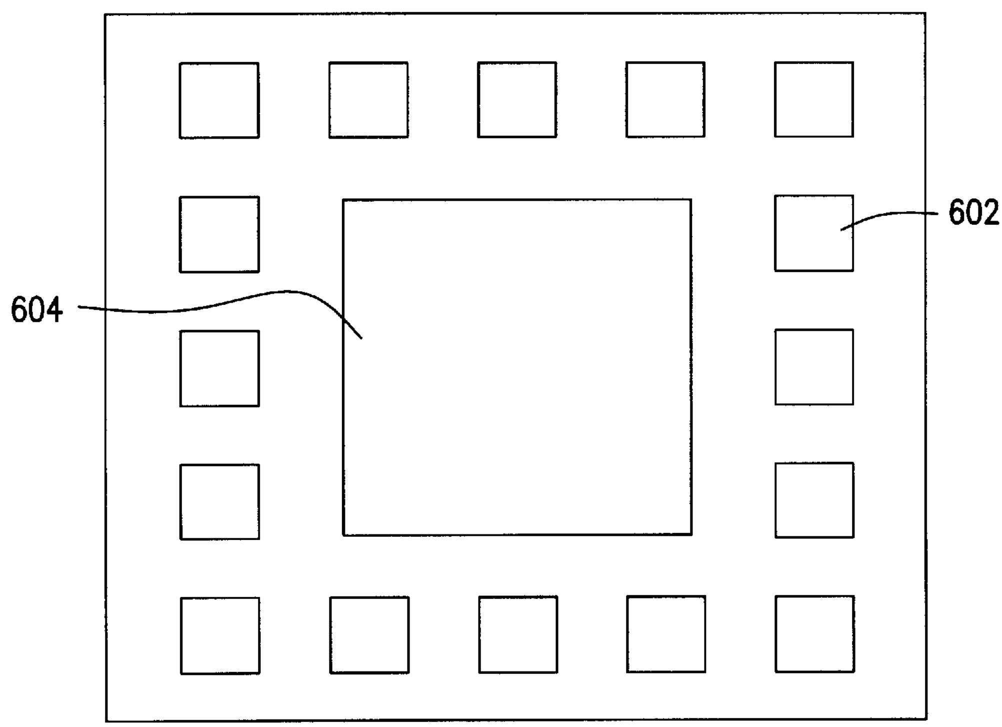
FIG. 6 illustrates a top view of the hybrid capacitor shown in FIG. 5 in accordance with one embodiment of the present invention.

In one embodiment, the discrete capacitors 514 are connected to the package around a perimeter of the die 516. FIG. 6 illustrates a top view of the hybrid capacitor shown in FIG. 5 in accordance with one embodiment of the present invention. This illustrates that a number of discrete capacitors 602 are dispersed around and in close proximity to the die 604. Although sixteen discrete capacitors 602 are illustrated in FIG. 6, more or fewer discrete capacitors 602 may be dispersed around the die in various embodiments.

Figure 7:
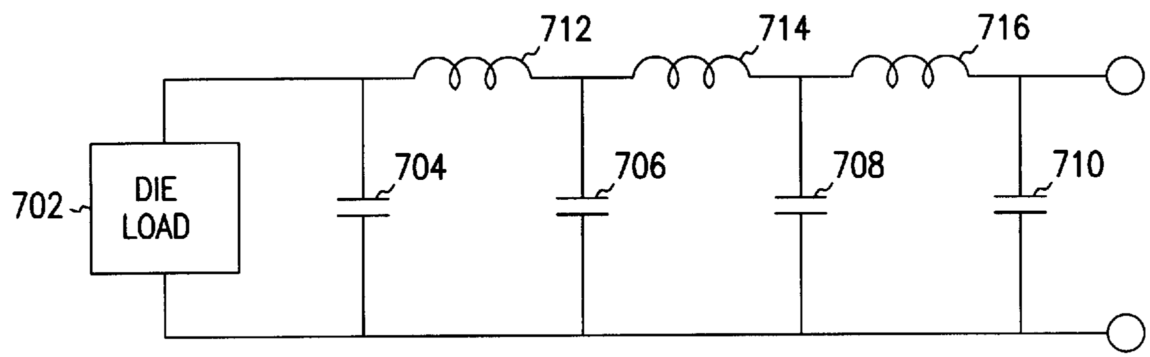
FIG. 7 illustrates an electrical circuit that simulates the electrical characteristics of the hybrid capacitor illustrated in FIG. 5.

During operation, the hybrid capacitor shown in FIG. 5 provides three levels of off-chip capacitance. This is modeled in FIG. 7, which illustrates an electrical circuit that simulates the electrical characteristics of the hybrid capacitor illustrated in FIG. 5.

The circuit shows a die load 702, which may require capacitance or noise dampening in order to function properly. Some of the capacitance can be supplied by capacitance 704 located on the die. Other capacitance, however, is provided off chip in accordance with one embodiment of the present invention, as indicated by off-chip capacitors 706, 708, and 710. Each of the off-chip capacitors 706, 708, 710 would more accurately be modeled as a capacitor in series with some resistance and inductance. For ease of illustration, however, off-chip capacitance is modeled as a simple capacitor.

Off-chip capacitor 706 represents the embedded low inductance and high dielectric capacitors formed by conductive layers 502, 504, 505, shown in FIG. 5. Capacitor 706 is located some distance, however small, from the die load 702. Accordingly, some inductance 712 exists between the die load and capacitor 706. In order to minimize this inductance 712, capacitor 706 is placed as close as possible to the die load 702.

Off-chip capacitors 708, 710 represent the self-aligned capacitors 508, 510, 516, and the discrete capacitors 514, shown in FIG. 5, where the type of capacitor that is electrically closer to the die load 702 is represented by capacitor 708. In some cases, a single die may have multiple loads dispersed throughout the die, making the self-aligned capacitors closer to some of the loads and the discrete capacitors closer to other loads. Regardless of which type of capacitance is closest to the load, both types exist some distance from the load and from the low inductance capacitor 706, resulting in some inductance 714, 716 between these off-chip capacitors 708, 710 and the die load 702. Again, these inductances 714, 716 are minimized by placing the self-aligned and discrete capacitors as close as possible to the die load 702.

Figure 8:
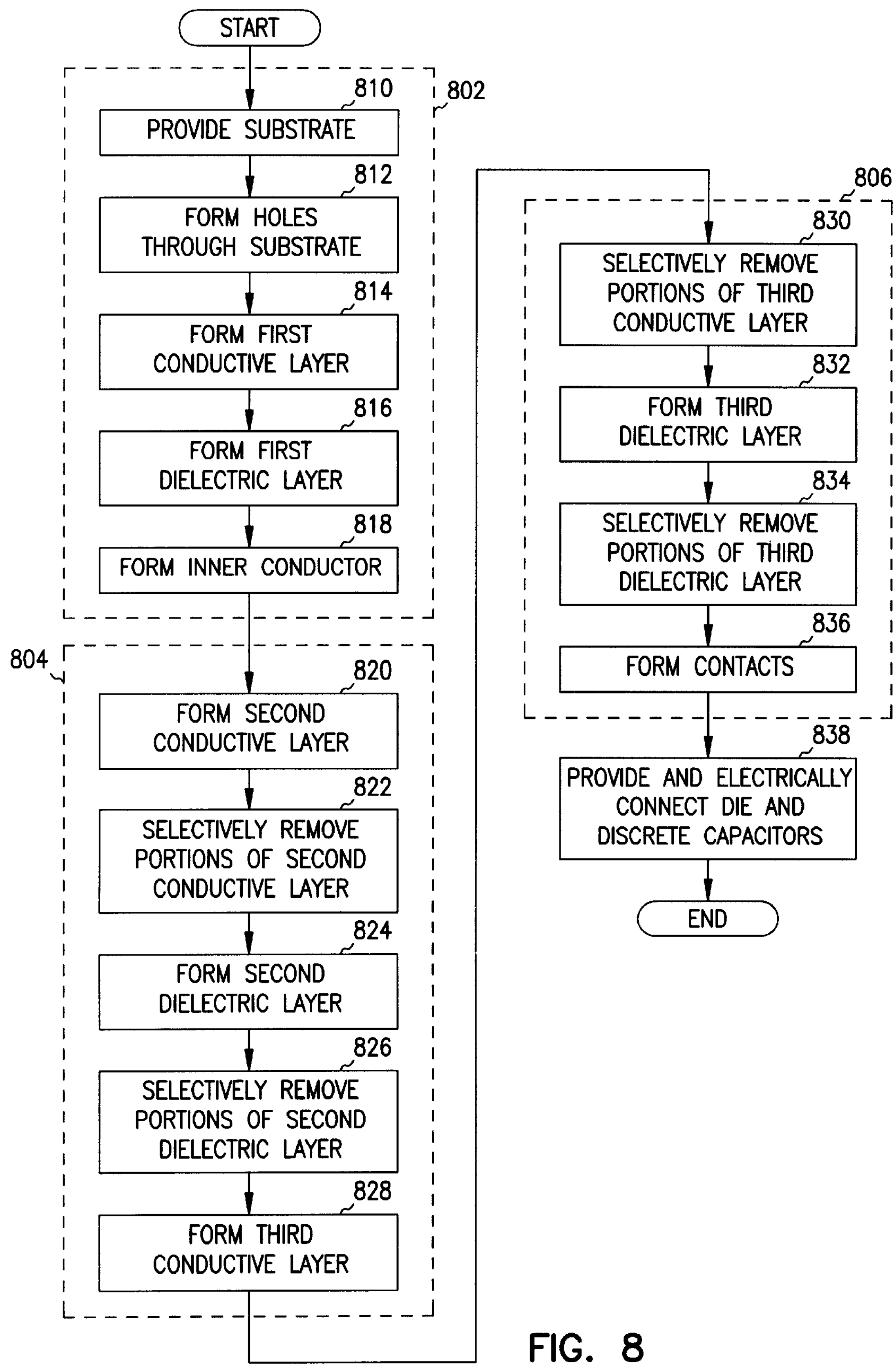
FIG. 8 illustrates a flowchart of a method for fabricating a hybrid capacitor in accordance with one embodiment of the present invention.
Figure 9:
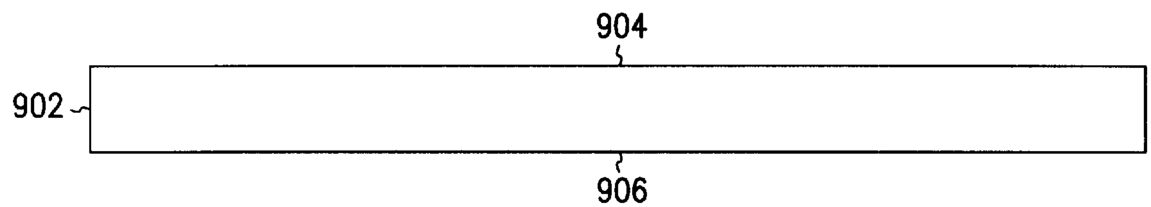
FIGS. 9–22 are schematic cross-sections illustrating various stages of fabricating a hybrid capacitor in accordance with one embodiment of the present invention.

FIG. 8 illustrates a flowchart of a method for fabricating a hybrid capacitor in accordance with one embodiment of the present invention. FIG. 8 should be viewed in conjunction with FIGS. 9–22, which are schematic cross-sections illustrating various stages of fabricating a hybrid capacitor in accordance with one embodiment of the present invention.

A method for fabricating the hybrid capacitor in accordance with one embodiment includes four main processes: 1) fabricating 802 a first package layer which includes a set of self-aligned via capacitors; 2) fabricating and electrically connecting 804 high dielectric and low inductance capacitors to the self-aligned via capacitors; 3) forming 806 contacts for electrically connecting discrete capacitors and a die; and 4) electrically connecting 838 the discrete capacitors and the die to the contacts. FIG. 8 shows these processes occurring in the above-listed order. In other embodiments, however, the fabrication of the hybrid capacitor assembly may occur in different orders.

Providing the first package layer, which includes a set of self-aligned via capacitors, is described in blocks 810–818 and shown in FIGS. 9–13. The process begins, in block 810, by providing a substrate 902 (FIG. 9), which has a substantially horizontal top surface 904 and bottom surface 906. In one embodiment, substrate 902 is an organic substrate, such as an epoxy material. For example, standard printed circuit board materials such as FR-4 epoxy-glass, polymide-glass, benzocyclobutene, Teflon, other epoxy resins, or the like could be used in various embodiments. In alternate embodiments, substrate 902 could consist of an inorganic substance, such as ceramic, for example.

In various embodiments, the thickness of substrate 902 is within a range of about 10–1000 microns. Substrate 902 could consist of one or multiple layers of substrate material, where each layer is within a range of about 10–40 microns in one embodiment. Substrate 902 and its associated layers could be thicker or thinner than these ranges in other embodiments.

Referring back to FIG. 8, in block 812, one or more series of holes or vias 1002 (FIG. 10) are formed through one or more layers of substrate 902. In various embodiments, the diameter of each via 1002 is within a range of about 50–300 microns, with it being approximately 200 microns in one embodiment. In addition, the length of each via 1002 could be in a range of about 10–1000 microns, depending on how many layers of substrate 902 each via extends through. The diameters and lengths of vias could be larger or smaller than these ranges in other embodiments.

Figure 10:
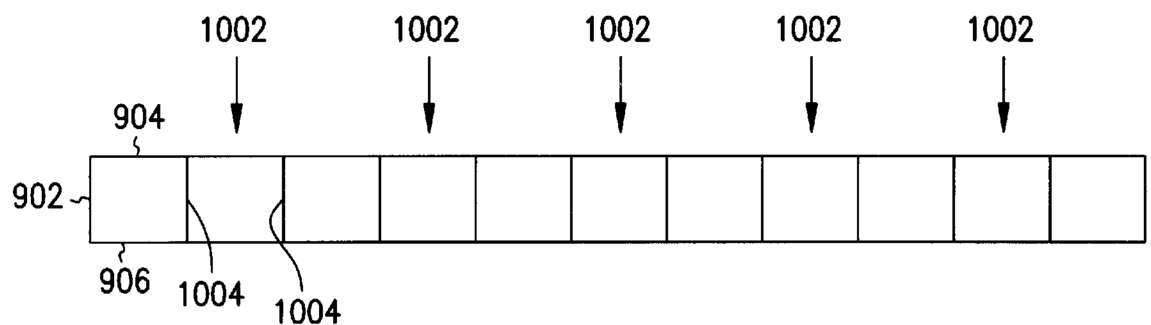

Although vias 1002 are shown as through holes (i.e., holes through all layers of substrate 902) in FIG. 10, each via 1002 could be bounded above and/or below by various layers of substrate 902. A via bounded on only one end is often termed a blind via, and a via bounded on both ends is often termed a buried via.

Vias 1002 are defined by sidewalls 1004, which are substantially vertical, or orthogonal, to the top and bottom surfaces 904, 906 of substrate 902. Vias 1002 are formed in a manner known in the art for forming an opening in a substrate. For example, in one embodiment, vias 1002 are mechanically drilled, although vias 1002 may also be punched, laser drilled, or formed using other technologies in various other embodiments. If substrate 902 is an inorganic substance, such as ceramic, other hole formation techniques known to those of skill in the art would be used. For example, substrate 902 could be created with vias 1002 already existing therein. Either way, blocks 810 and 812 result in the fabrication of a substrate 902 having a top surface 904 through which one or more holes 1002 are formed, where those holes are defined by sidewalls 1004.

Referring back to FIG. 8, in block 814, a conductive material layer 1102 (FIG. 11) is formed on the sidewalls of holes 1002. Portions of conductive layer 1102 formed on sidewalls 1004 define plated vias 1104. Each plated via 1104 represents the outer conductor of a self-aligned via capacitor, shown as conductor 508 of FIG. 5.

In one embodiment, layer 1102 overlies at least a portion of top and bottom surfaces 904, 906 of substrate 902. In another embodiment, layer 1102 overlies all or a portion of top surface 904, but does not overlie any portion of bottom surface 906. The portions of conductive layer 1102 overlying the top and bottom surfaces 904, 906 of the substrate form top and bottom surfaces 1106, 1108 of conductive layer 1102. The top surface 1106 of conductive layer 1102 forms the bottom conductor of a high inductance capacitor, in one embodiment, or the bottom conductor of a low dielectric capacitor, in another embodiment.

In one embodiment, conductive layer 1102 is a copper layer, although other conductive metals such as tin, lead, nickel, gold, and palladium, or other materials could be used in other embodiments. In various embodiments, the thickness of conductive layer 1102 is within a range of about 5–15 microns, with it being approximately 10 microns in one embodiment. Conductive layer 1102 could be thicker or thinner than that range in other embodiments.

In one embodiment, conductive layer 1102 is formed using standard techniques for forming a conductive layer. In one embodiment, layer 1102 is formed by depositing a seed layer, such as sputter-deposited or electroless-deposited copper, on the substrate 902, followed by electrolytic plating a layer of copper on the seed layer. In another embodiment, layer 1102 is formed using standard photolithographic techniques. Other methods of depositing layer 1102 will be apparent to those skilled in the art, such as screen printing or other printing of conductive inks. In still another embodiment, rather than using a substrate without a conductive material in block 810, a clad laminate, such as a copper-clad laminate, could be used, making block 814 unnecessary.

Referring back to FIG. 8, in block 816, a dielectric layer 1202 (FIG. 12) is formed over conductive layer 1102. The portions of dielectric layer 1202 overlying the plated via 1104 represent the dielectric layer disposed between the inner and outer conductors of the self-aligned via capacitor, shown as layer 516 in FIG. 5. In addition, the dielectric layer may form the dielectric layer between the plates of a high dielectric capacitor, in one embodiment, or a low inductance capacitor, in another embodiment. When the dielectric layer is associated with a high dielectric capacitor, it has a high dielectric constant and is relatively thin. In one embodiment, the dielectric constant is in a range of 2000 to 5000, although it could be higher or lower in other embodiments. When the dielectric layer is associated with a low inductance capacitor, it has a dielectric constant in a range of 1 to 1000, although it could be higher or lower in other embodiments. In one embodiment the thickness is in a range of 0.3 to 5 microns, although it could be thicker or thinner in other embodiments.

In one embodiment, dielectric layer 1202 contains a metal oxide, such as tantalum oxide ($Ta_2O_5$). The metal oxide may be formed using a physical vapor deposition technique of the metal, and anodizing the layer of the metal in a weak acid electrolyte to form the metal oxide. For example, the metal may be sputter deposited from a metal target to form a layer of the metal. In one embodiment, a shadow mask can be placed on or in close proximity to the substrate to block or mask areas where deposition is not desired.

Physical vapor deposition techniques can be carried out from both surfaces 1106, 1108 (FIG. 11), so that the dielectric layer 1202 is formed to overlie the plated vias 1104, and the top and bottom surfaces 1106, 1108 of the conductive layer 1102. In another embodiment, the deposition process can be carried out only from the first surface 1106 of the conductive layer 1102, so that dielectric layer 1202 is formed to overlie plated vias 1104 and a portion of the first surface 1106, but not to overlie a portion of the second surface 1108. Alternatively, a metal layer may be deposited by electrolytic plating or photolithographic techniques, and converted to the metal oxide by anodization in a weak acid electrolyte.

The thickness of the oxide can be controlled through the application of a controlled voltage. Remaining non-oxidized metal in the dielectric layer 1202 is not a concern, as it will reside at the interface between the conductive layer 1102 and the dielectric layer 1202, and thus not adversely affect the resulting capacitance given its conductivity.

In another embodiment, dielectric layer 1202 can be formed by RF sputtering from a composite target of a dielectric material, or through reactive sputtering from multiple elemental targets, without the need for anodization or other oxidation techniques. Metal organic chemical vapor deposition (MOCVD) and sol-gel techniques have further been utilized to directly form metal oxide dielectrics. Other techniques of forming layers of dielectric material are known in the art and can include chemical vapor deposition (CVD) and plasma-enhanced CVD. Furthermore, other dielectric materials can be utilized with the various embodiments. Examples of other dielectric materials include strontium titanate (SrTiO3), barium titanate (BaTiO3), barium strontium titanate (BaSrTiO3; BST), lead zirconium titanate (PbZrTiO3; PZT), aluminum oxide (Al2O3), or zirconium oxide (Zr2O3), often formed by sputtering from a composite target or by MOCVD. Further examples include more conventional dielectric materials, such as silicon dioxide (SiO2), silicon nitride (SiN), and silicon oxynitride (SiOxNy).

The dielectric layer 1202 is formed to overlie at least that portion 1104 of conductive layer 1102 formed on sidewalls 1104. Furthermore, the dielectric layer 1202 is formed to leave a portion of the plated via unfilled.

Referring back to FIG. 8, in block 818, an inner conductor 1302 (FIG. 13) is formed in the remaining portion of the plated via that is not filled by the dielectric layer 1202. Each inner conductor 1302 represents the inner conductor of a self-aligned via capacitor, shown as conductor 510 in FIG. 5. The inner conductor 1302 is formed by depositing a conductive material within the area within the vias that is not filled by the dielectric layer 1202. In one embodiment, this is done by filling the remaining portion of the via with a conductive paste. The conductive paste is cured, in one embodiment.

A second conductive layer 1304 (FIG. 13) also is formed on the top surface of the dielectric layer 1202 in block 820. The second conductive layer 1304 represents the bottom conductive layer of the low inductance capacitor, shown as layer 504 in FIG. 5. In one embodiment, the thickness of the second conductive layer is within a range of about 10 to 30 microns, although it could be thicker or thinner than this range in other embodiments. The second conductive layer can be formed, in various embodiments, using techniques described for forming the first conductive layer 1102.

In another embodiment, rather than performing blocks 818 and 820 as separate processes, electroless plating followed by electrolytic plating of metal, such as copper, can be used to form a layer of electroplated metal overlying at least the portion of dielectric layer 1202 formed in the plated via 1104, and also to plate the top surface. In this embodiment, the inner conductor 1302 may have generally a hollow structure defined by the structure of the remaining portion of the via left unfilled, even though the plated metal may completely fill the via. Any portion of the via unfilled by the resulting layer of electroplated metal in this embodiment can be optionally filled (e.g., with a polymer via plug or conductive paste), as is known in the art. Other methods, such as many of those described for the formation of the first conductive layer 1102, can also be used to form a conductive layer as the inner conductor 1302 in the remaining portion of the via left unfilled by dielectric layer 1202.

Referring back to FIG. 8, in block 822, portions 1402 (FIG. 14) of the second conductive layer 1304 are selectively removed, exposing portions of the conductive layer 1202 underneath the removed portions. Removal of the portions of conductive material could be performed, for example, using a common subtractive technology, such as chemical mechanical planarization to physically abrade away the material. Alternatively, a photo or laser imaging and etching process could be used. Other subtractive technologies could be used in other embodiments. In still other embodiments, additive technology could be used to deposit the desired portions of second conductive layer 1304. For example, rather than plating and subtracting portions of second conductive layer 1304, portions of second conductive layer 1304 could be selectively screened or stenciled using a conductive paste.

In block 824, a second dielectric layer 1502 (FIG. 15) is formed on the second conductive layer 1304. The second dielectric layer 1502 represents the dielectric layer disposed between the top and bottom conductive layers of the low inductance capacitor, shown as layer 506 in FIG. 5. The second dielectric layer 1502 should be very thin, and be composed of a material that has a very low dielectric constant. In one embodiment, the dielectric layer has a thickness within a range of about 0.3 to 5 microns. In alternate embodiments, the thickness of the dielectric layer could be a value larger or smaller than this range.

Figure 12:
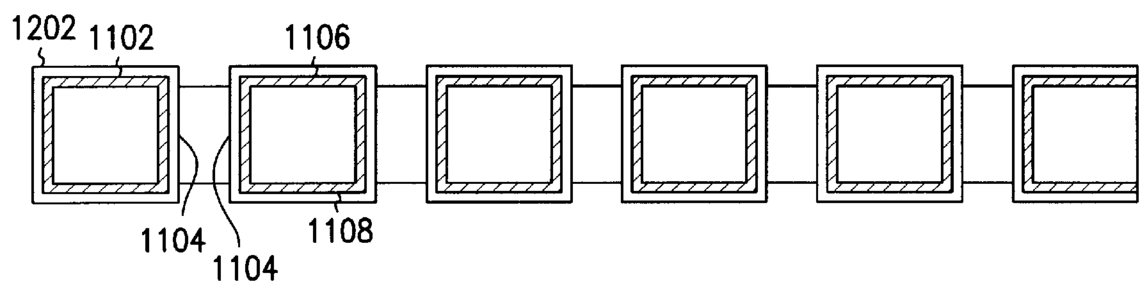

In addition, the dielectric constant could be in the range of about 1 to 1000, with the materials that produce the fastest charge propagation being at the lower end of the range. In other embodiments, the dielectric constant could have a value outside this range. The attributes of the dielectric layer 1502 should result in a rapid propagation of charge, when needed. The second dielectric layer 1502 can be formed using techniques described above for formation of the first dielectric layer 1202 (FIG. 12). As described previously, in an alternate embodiment, the high inductance capacitor could be located above the low inductance capacitor, in which case second dielectric layer may have a dielectric constant in a range of about 2000 to 5000, although the dielectric constant could be higher or lower in other embodiments.

Portions 1602 (FIG. 16) of the second dielectric layer 1502 are then selectively removed, in block 826. This provides access to portions of the first conductive layer 1102, while maintaining the electrical isolation of the first conductive layer 1102 and the second conductive layer 1304. Selective removal can be achieved, for example, using chemical mechanical planarization or other techniques known to those of skill in the art.

In block 828, a third conductive layer 1702 (FIG. 17) and interconnects 1704 are formed on the top surface of the assembly, and in the removed portions of the second dielectric layer 1502. The third conductive layer 1702 represents the top conductive layer of the low inductance capacitor, such as layer 502 shown in FIG. 5. In one embodiment, the thickness of the third conductive layer is within a range of about 10 to 30 microns, although it could be thicker or thinner than this range in other embodiments.

Forming the third conductive layer 1702 can be performed using techniques previously described. In various embodiments, this can be performed in multiple steps (e.g., fill the holes 1602 in the second dielectric layer then form the third conductive layer) or as a single step (e.g., electroless and electrolytic plating).

Referring back to FIG. 8, after formation of the embedded low inductance capacitor, electrical connections to these plates are formed as described in blocks 830–836 and shown in FIGS. 18–21. In block 830, portions 1802 (FIG. 18) of the third conductive layer 1702 are selectively removed, using techniques described previously. Next, in block 832, a third dielectric layer 1902 (FIG. 19) is formed over the third conductive layer 1702 and the removed portions, also using techniques previously described.

Portions 2002 (FIG. 20) of the additional dielectric layer 1902 are then selectively removed, in block 834. These removed portions 2002 expose the conductive material on portions of the bottom and top conductive layers 1304, 1702 of the low inductance capacitor. In addition, the removed portions 2002 coincide with the desired locations for electrical connections to a die and discrete capacitors. Selective removal of portions 2002 of the additional dielectric layer 1902 can be performed using techniques previously described, such as chemical mechanical planarization, for example, or other techniques known to those of skill in the art.

Figure 11:
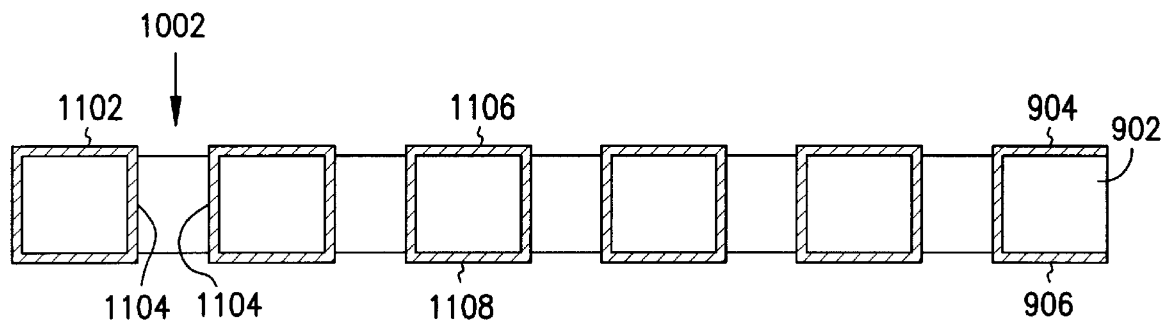
Figure 13:
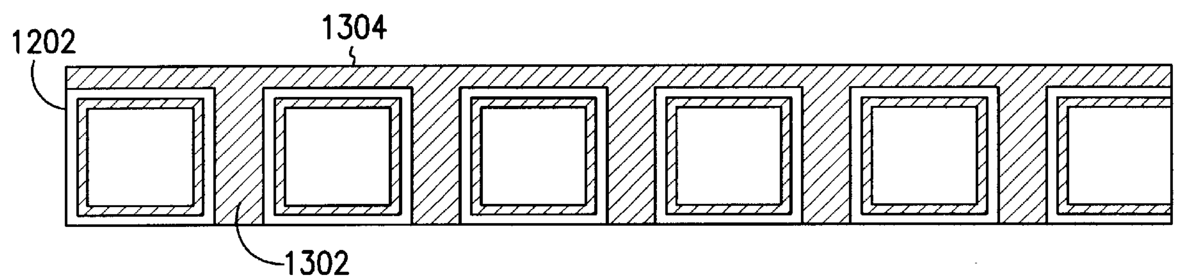
Figure 14:
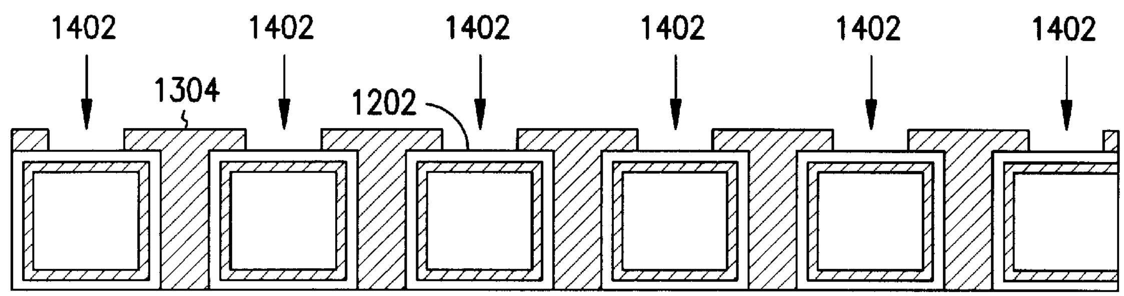
Figure 15:
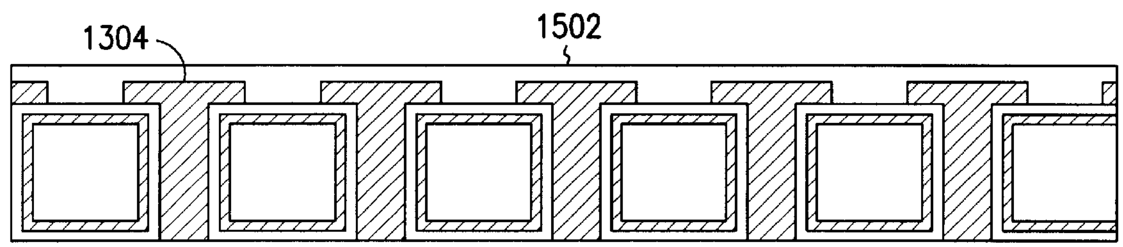
Figure 16:
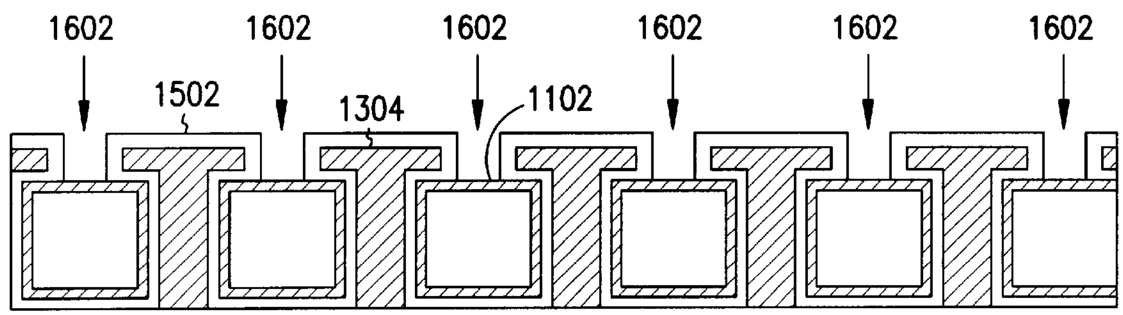
Figure 17:
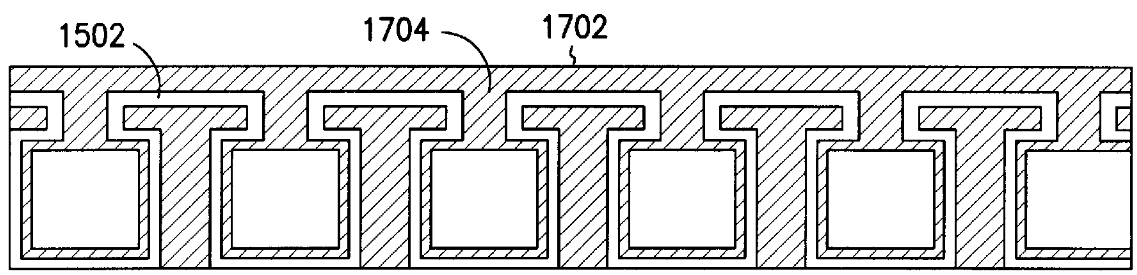
Figure 18:
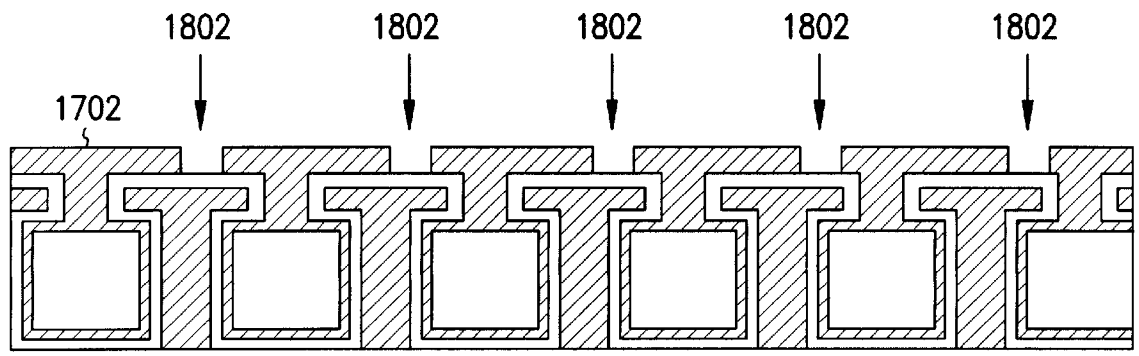
Figure 19:
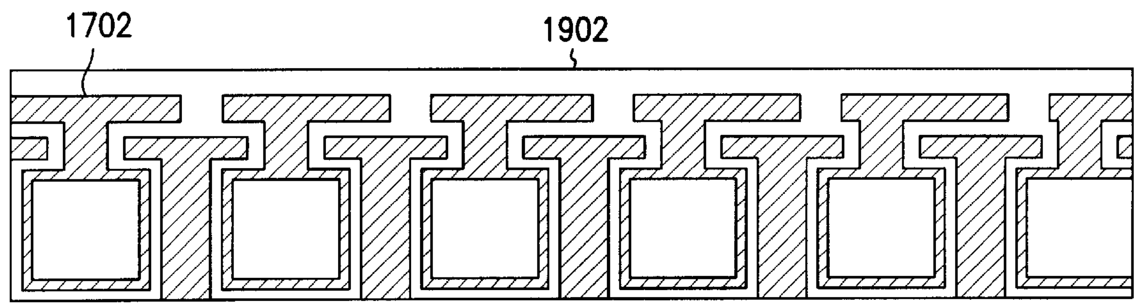
Figure 20:
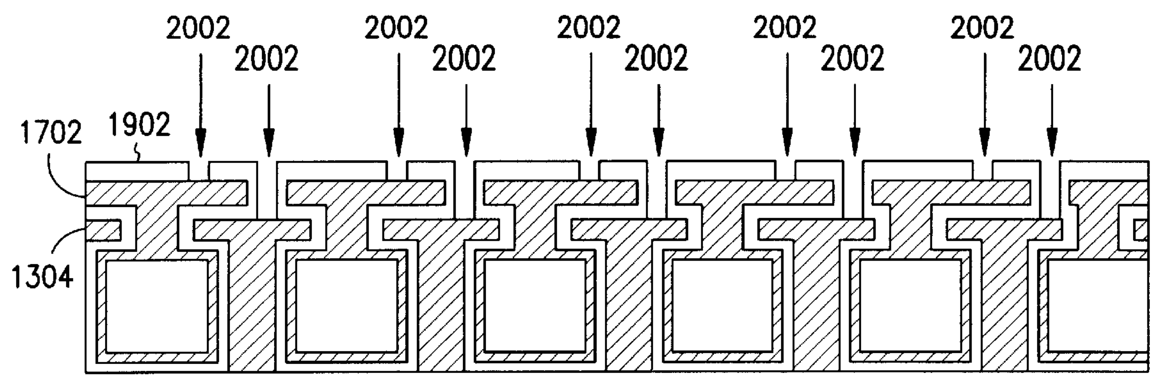
Figure 21:
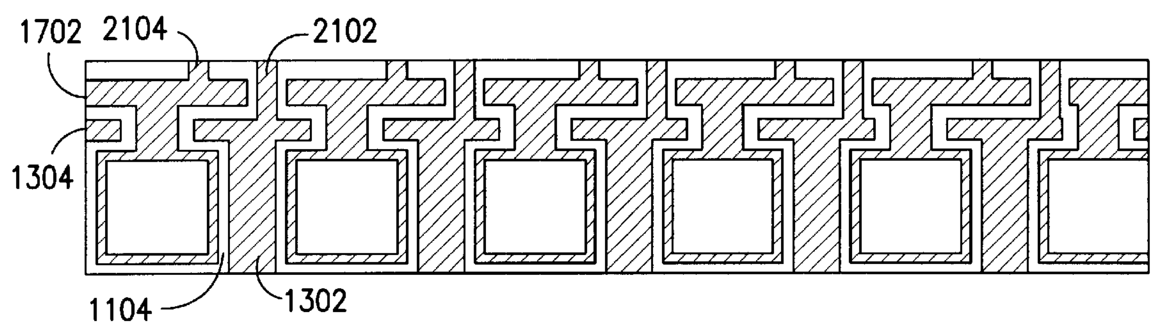

Contacts 2102, 2104 (FIG. 21) are then formed, in block 836, to couple the exposed portions of the bottom and top conductive layers 1304, 1702, respectively, to the top of the package. One set of contacts 2102 is electrically connected to the bottom conductive layer 1304, and the other set of contacts 2104 is electrically connected to the top conductive layer 1702. These contacts can be formed using techniques previously described, such as filling the selectively removed portions of dielectric with conductive paste, electrolytic plating, photolithography, and/or screen printing, for example. This results in a package that includes an embedded low inductance capacitor, comprised of top and bottom conductive layers 1702, 1304, and a set of self-aligned via capacitors, composed of outer and inner conductors 1104, 1302 (FIGS. 11, 13).

During operation, at least one contact from the first set of contacts 2102 is coupled to a first potential source, and at least one contact from the second set of contacts 2104 is coupled to a second potential source. For example, the first and second potential sources can be a ground potential and a supply potential, Vcc. Which set of contacts 2102, 2104 is coupled to which potential source is a matter of design, as either set can be connected to either source. In an alternate embodiment, the potential sources could be coupled directly to the bottom and top conductive layers 1304, 1702, or they could be coupled to the outer and inner conductors 1104, 1302 (FIGS. 11, 13) of the self-aligned via capacitors.

Referring back to FIG. 8, in block 838, one or more discrete capacitors 2202 (FIG. 22) and a die 2204 are provided and electrically connected to some or all of contacts 2102, 2104. The discrete capacitors 2202 and die 2204 can be connected, for example, by depositing solder bumps on the contacts 2102, 2104, and/or pads (not shown) on die 2204 and capacitors 2202, and reflowing the solder once the capacitors 2202 and die 2204 are arranged over the corresponding contacts.

In alternate embodiments, different techniques can be used to interconnect and isolate the various conducting portions of the self-aligned, parallel plate, and discrete capacitors. For example, rather than forming and selectively removing portions of the various conducting and non-conducting layers, openings between the various layers could be included by selectively adding the desired portions of the conducting and non-conducting layers. In other embodiments, removal techniques, such as chemical mechanical planarization, can be used to physically abrade away multiple layers of different types of conducting and non-conducting materials, resulting in the desired openings for various interconnects. In addition, additional layers (not shown) of patterned conductive material and dielectric layers could be disposed between the layers of material shown in the Figures. These additional layers could carry signals, power, and ground to the die.

Figure 22:
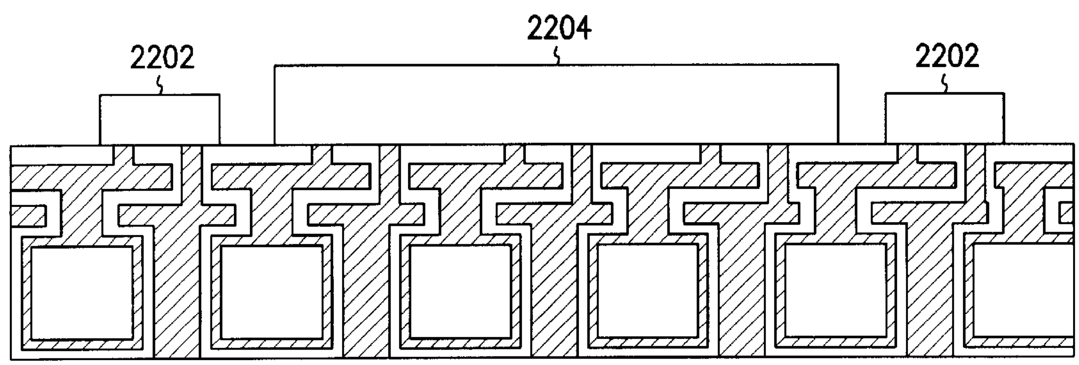

Although five self-aligned capacitors and two discrete capacitors are shown in FIG. 22, the number of each type of capacitor can be varied during the design process to adjust the capacitance values and other electrical characteristics. FIG. 22 also shows various holes in the top and bottom conductive layers of the low inductance capacitor, where these holes enable insulated contacts from the self-aligned capacitors or from the bottom conductive layer to extend upward. In practice, the top and bottom conductive layers would likely include many other holes (not shown) for allowing various inputs, outputs, power, and ground signals to reach the die or other components. In addition, although various conducting and nonconducting material layer sizes and locations are illustrated with specific relative dimensions, the relative dimensions and locations of the layers can also be varied during the design process to adjust the capacitance and other electrical characteristics of the structure.

In the embodiment shown in FIG. 22, various loads on the die 2204 are provided with three sources of off-chip capacitance (i.e., the parallel plate capacitors, the self-aligned capacitors, and the discrete capacitors). When a portion of the die, referred to as a die "hot spot," needs a very large amount of current, the first charge that will respond to the current need will come from the capacitance on the die. Next, charge will be provided by the low inductance capacitor; however, since it has a low dielectric constant, the main job of this capacitor is to provide a fast propagation path for the charge. The low inductance capacitor also provides a very low inductance path to the capacitance supplied by the self-aligned capacitors, which release all of the integrated capacitance to provide the next level of charge. Finally, the low inductance capacitor also provides a low inductance path to the discrete capacitors, which provide an additional level of charge. Depending on the location of the die hot spot, the discrete capacitors may respond before the self-aligned capacitors.

In alternate embodiments, either the self-aligned or the discrete capacitors can be left out of the design, and thus the various die loads would be provided with two sources of off-chip capacitance. These embodiments are shown in FIGS. 23 and 24.

Figure 23:
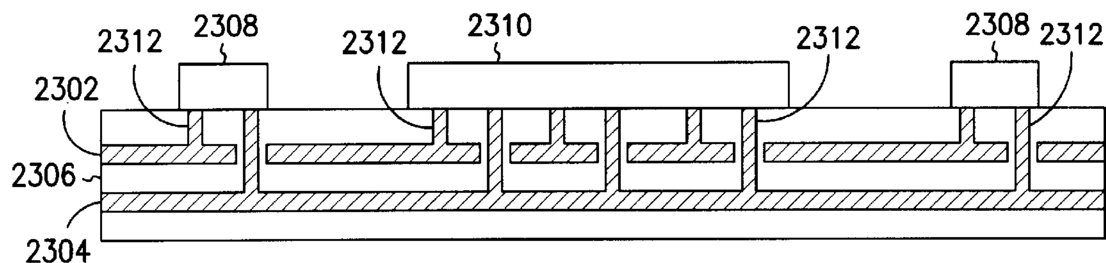
FIG. 23 illustrates a cross-section of a hybrid capacitor that includes a low inductance capacitor and at least one discrete capacitor in accordance with one embodiment of the present invention.

FIG. 23 illustrates a cross-section of a hybrid capacitor that includes a low inductance capacitor and at least one discrete capacitor in accordance with one embodiment of the present invention. The low inductance capacitor includes a top conductor 2302 and a bottom conductor 2304 separated by a very thin, low dielectric material layer 2306. Discrete capacitors 2308 and die 2310 are electrically connected to the top and bottom conductors 2302, 2304 by contacts 2312. In this manner, two levels of off-chip capacitance (i.e., low inductance capacitor and discrete capacitors) are supplied to various loads (not shown) on die 2310. This off-chip capacitance has a low inductance path to the die loads via the top and bottom conductors 2302, 2304.

Figure 24:
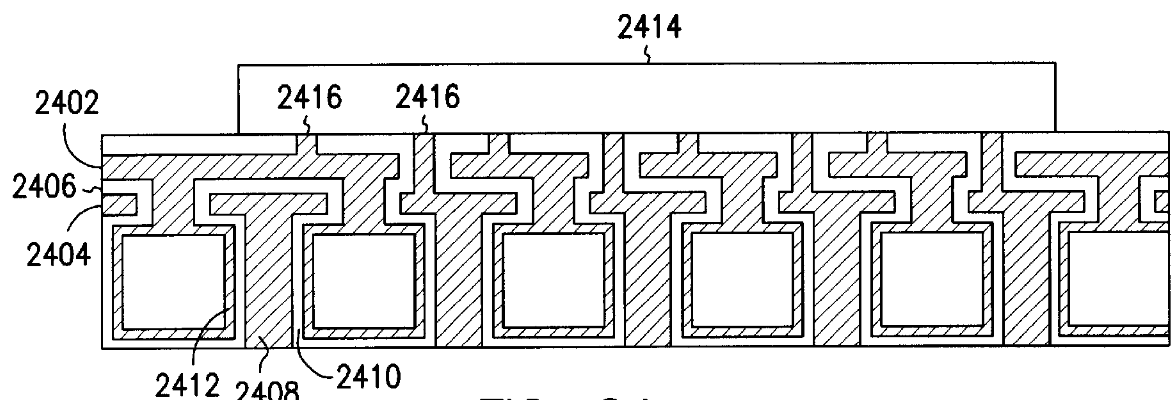
FIG. 24 illustrates a cross-section of an integrated hybrid capacitor that includes a low inductance capacitor and a set of self-aligned via capacitors in accordance with one embodiment of the present invention.

FIG. 24 illustrates a cross-section of an integrated hybrid capacitor that includes a low inductance capacitor and a set of self-aligned via capacitors in accordance with one embodiment of the present invention. Similar to the above-described hybrid capacitor, the low inductance capacitor includes a top conductor 2402 and a bottom conductor 2404 separated by a very thin, low dielectric material layer 2406.

A set of self-aligned capacitors, each composed of an inner conductor 2408, a thin dielectric layer 2410, and an outer conductor 2412, are electrically connected to the top and bottom conductors 2402, 2404. In addition, a die 2414 is electrically connected to the top and bottom conductors 2402, 2404 via contacts 2416. In this manner, two levels of off-chip capacitance (i.e., low inductance capacitor and self-aligned capacitors) are supplied to various loads (not shown) on die 2414. This off-chip capacitance has a low inductance path to the die loads via the top and bottom conductors 2402, 2404.

The self-aligned capacitors shown in FIGS. 4, 5, 22, and 24 can exist within one layer of the package substrate, in one embodiment. In alternate embodiments, one or more of the self-aligned capacitors can exist through multiple layers of the substrate. For example, a particular self-aligned capacitor could be formed using multiple vias that are stacked on top of each other. Stacking vias of equal diameters directly on top of one another may be difficult using current technologies. Therefore, in one embodiment, the multi-level, self-aligned capacitor is formed from micro-vias, which are vias that are stacked on top of each other, with each higher via having a smaller diameter than the via below it. In another embodiment, the vias that form a self-aligned capacitor are stacked, but each via is slightly offset from the via below it. This would result in a jagged or crankshaft-like structure from the bottom of the stacked via structure to the top.

In other embodiments, some or all of the self-aligned vias may exist in substrate levels that are not directly below the bottom conductive layer of the low inductance capacitor. In addition, in various embodiments, the low inductance capacitor may be separated from the top of the package by one or more substrate layers.

Figure 25:
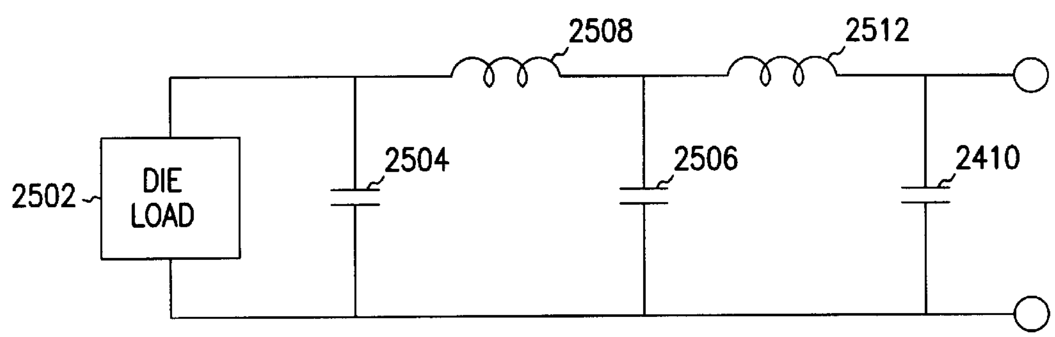
FIG. 25 illustrates an electrical circuit that simulates the electrical characteristics of the hybrid capacitors illustrated in FIGS. 23 and 24.

FIG. 25 illustrates an electrical circuit that simulates the electrical characteristics of the hybrid capacitors illustrated in FIGS. 23 and 24. The circuit shows a die load 2502, which may require capacitance or noise dampening in order to function properly. Some of the capacitance can be supplied by capacitance 2504 located on the die. Other capacitance, however, is provided off chip in accordance with various embodiments of the present invention, as indicated by off-chip capacitors 2506 and 2510.

Off-chip capacitor 2506 represents the embedded low inductance capacitor formed by conductive and dielectric layers 2302, 2304, 2306 (FIG. 23) or 2402, 2404, 2406 (FIG. 24). Capacitor 2506 is located some distance, however small, from the die load 2502. Accordingly, some inductance 2508 exists between the die load and capacitor 2506. In order to minimize this inductance 2508, capacitor 2506 is placed as close as possible to the die load 2502.

Off-chip capacitor 2510 represents either the discrete capacitors 2308 shown in FIG. 23, or the self-aligned capacitors shown in FIG. 24. This capacitance 2510 exists some distance from the load and from the low inductance capacitor 2506, resulting in some inductance 2512 between off-chip capacitor 2510 and the die load 2502. Again, this inductance 2512 is minimized by placing the self-aligned or discrete capacitors as close as possible to the low inductance capacitor 2506 and the die load 2502.

Figure 26:
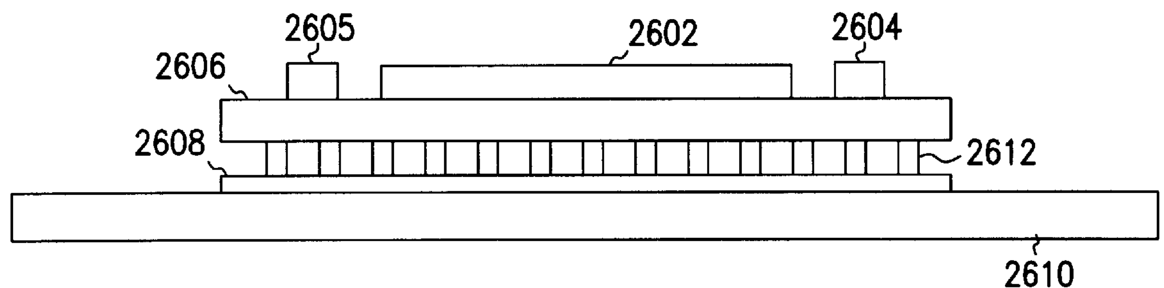
FIG. 26 illustrates an integrated circuit package that includes a hybrid capacitor in accordance with one embodiment of the present invention.

FIG. 26 illustrates an integrated circuit package that includes a hybrid capacitor in accordance with one embodiment of the present invention. Starting from the top of FIG. 26, an integrated circuit 2602 and one or more discrete capacitors 2604 are housed by IC package 2606. Integrated circuit 2602 contains one or more circuits which are electrically connected to IC package 2606 by connectors (not shown). One or more of the IC circuits act as a load, which may require capacitance, noise suppression, and/or power dampening. Some of this capacitance is provided, in one embodiment of the present invention, by discrete capacitors 2604.

Integrated circuit 2602 could be any of a number of types of integrated circuits. In one embodiment of the present invention, integrated circuit 2602 is an microprocessor, although integrated circuit 2602 could be other types of devices in other embodiments. In the example shown, integrated circuit 2602 is a "flip chip" type of integrated circuit, meaning that the input/output terminations on the chip can occur at any point on its surface. After the chip has been readied for attachment to IC package 2606, it is flipped over and attached, via solder bumps or balls to matching pads on the top surface of IC package 2606. Alternatively, integrated circuit 2602 could be a surface mount chip, where input/output terminations are connected to IC package 2606 using bond wires to pads on the top surface of IC package 2606.

Embedded within package 2606 is a low inductance capacitor, as described previously. In addition, in one embodiment, a set of self-aligned via capacitors are embedded within package 2606. The low inductance capacitor and the discrete and/or self-aligned capacitors function together to provide multiple levels of additional capacitance to integrated circuit 2602, and also to provide power dampening and noise suppression, when needed. The close proximity of these off-chip sources of capacitance means that each source has a relatively low inductance path to the die. In other embodiments, the embedded low inductance capacitor, and/or the self-aligned capacitors, and/or the discrete capacitors could be embedded within or mounted on the PC board 2610, or on an interposer (i.e., a board that provides a dimensional interface between a package and a printed circuit board).

IC package 2606 is coupled to a socket 2608 on a PC board 2610. In the example shown, IC package 2606 includes pins 2612 that mate with complementary pin holes in socket 2608. Alternatively, IC package 2606 could be electrically and physically connected to PC board 2610 using solder connections, such as ball grid array connections, for example.

PC board 2610 could be, for example, a mother board of a computer system. As such, it acts as a vehicle to supply power, ground, and other types of signals to integrated circuit 2602. These power, ground, and other signals are supplied through traces (not shown) on PC board 2610, socket 2608, pins 2612, and traces (not shown) on IC package 2606.

Figure 27:
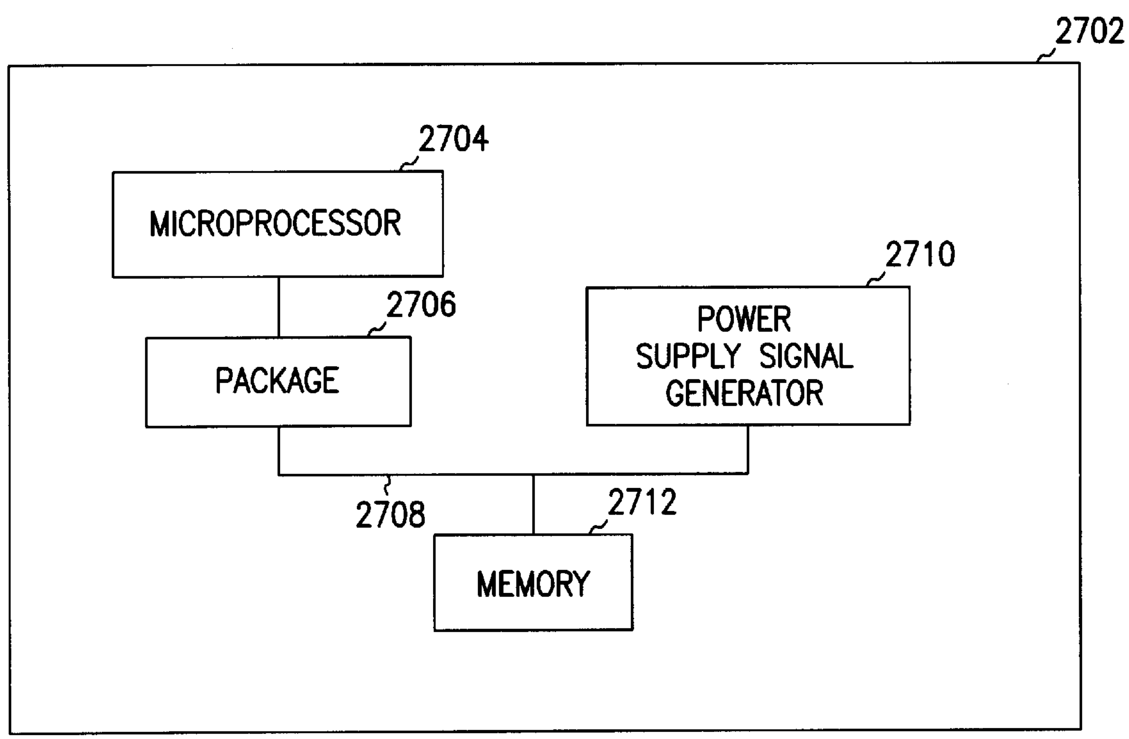
FIG. 27 illustrates a general purpose computer system in accordance with one embodiment of the present invention.

The IC package described above in conjunction with various embodiments could be connected to a PC board forming part of a general purpose computer system. FIG. 27 illustrates a general purpose computer system 2702, which includes a hybrid capacitor in accordance with various embodiments of the present invention.

Computer system 2702 is housed on PC board and includes microprocessor 2704, package 2706, bus 2708, power supply signal generator 2710, and memory 2712. Package 2706 includes a hybrid capacitor in accordance with various embodiments of the present invention, described above. Package 2706 couples microprocessor 2704 to bus 2708 in order to communicate power supply signals and non-power supply signals between microprocessor 2704 and devices coupled to bus 2708. For the embodiment of the present invention shown in FIG. 27, bus 2708 couples microprocessor 2704 to memory 2712 and power supply signal generator 2710. However, it is to be understood that in alternative embodiments of the present invention, microprocessor 2704 can be coupled to memory 2712 and power supply signal generator 2710 through two different busses.

Conclusion

Thus, various embodiments of a hybrid capacitor and methods of fabricating that capacitor have been described, along with a description of the incorporation of a package and/or interposer that includes that capacitor on a PC board within a general purpose computer system. Embodiments of the present invention provide a hybrid capacitor that can be used in place of various discrete components on an integrated circuit package, interposer or printed circuit board.

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description of the preferred embodiments, reference is made to the accompanying drawings which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown. For example, illustrative embodiments describe vias between two levels of interconnect. However, those skilled in the art will recognize that many interconnect levels may be connected by vias in accordance with the present invention. In addition, additional layers of patterned conductive materials and interconnects for carrying signals, power, and ground may exist between, above, or below the layers shown in the figures.

The various embodiments, above, have been described in the context of providing excess, off-chip capacitance to a die. One of ordinary skill in the art would understand, based on the description herein, that the method and apparatus of the present invention could also be applied in many other applications where a hybrid capacitor having a low inductance path to a circuit load are desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. A method for fabricating a hybrid capacitor within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer; and fabricating and electrically connecting a second source of capacitance to the parallel plate capacitor, wherein the second source of capacitance is formed in a second layer of the package, and is formed from a set of self-aligned via capacitors embedded within the second layer, and each of the self-aligned via capacitors includes an inner conductor electrically connected to the first conductive layer, and an outer conductor electrically connected to the second conductive layer.

2. The method as claimed in claim 1, further comprising:

forming contacts to a surface of the integrated circuit package, wherein at least one of the contacts electrically connects the first conductive layer to the surface and at least one other of the contacts electrically connects the second conductive layer to the surface; and wherein electrically connecting the second source of capacitance comprises electrically connecting one or more discrete capacitors to the contacts.

3. The method as claimed in claim 2, wherein forming the contacts comprises forming the contacts around a perimeter of an area where an integrated circuit will be electrically connected to the package.

4. The method as claimed in claim 1, wherein fabricating the parallel plate capacitor comprises:

forming a bottom conductor from a conductive material, wherein the bottom conductor can act as the first conductive layer or the second conductive layer;

forming the dielectric layer on the bottom conductor; and forming a top conductor by plating a top surface of the dielectric layer, wherein the top conductor can act as the second conductive layer or the first conductive layer.

5. The method as claimed in claim 4, wherein forming the dielectric layer comprises forming a dielectric layer having a thickness within a range of about 0.3 to 5 microns, and the dielectric layer has a dielectric constant in a range of about 1 to 1000.

6. The method as claimed in claim 1, further comprising electrically connecting a third capacitor to the parallel plate capacitor, wherein the third capacitor is an off-chip capacitor with a third conductor electrically connected to the first conductive layer, and a fourth conductor electrically connected to the second conductive layer.

7. The method as claimed in claim 1, further comprising:

forming contacts to a surface of the integrated circuit package, wherein at least one of the contacts electrically connects the first conductive layer to the surface, and at least one other of the contacts electrically connects the second conductive layer to the surface; and electrically connecting an integrated circuit to the contacts.

8. A method for fabricating a hybrid capacitor within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer;

fabricating a second source of capacitance to the parallel plate capacitor, wherein the second source of capacitance includes a first conductor electrically connected to the first conductive layer, and a second conductor electrically connected to the second conductive layer; and electrically connecting the second source of capacitance to the parallel plate capacitor by fabricating a second layer of the package, wherein the second source of capacitance is formed from a set of self-aligned via capacitors embedded within the second layer, each of the self-aligned via capacitors having an inner conductor and an outer conductor, electrically connecting the inner conductor to the first conductive layer, and electrically connecting the outer conductor to the second conductive layer.

9. The method as claimed in claim 8, wherein fabricating the second layer comprises:

forming the outer conductor by forming a layer of conductive material on sidewalls and at least a portion of a top surface of a substrate, wherein one or more holes are formed in the substrate, and the one or more holes are defined by the sidewalls;

forming a dielectric layer within the one or more holes on at least a portion of the outer conductor that covers the sidewalls; and forming the inner conductor within the one or more holes by depositing a conductive material within an area within the one or more holes that is not filled by the dielectric layer.

10. A method for fabricating a hybrid capacitor within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer;

fabricating and electrically connecting a second source of capacitance to the parallel plate capacitor, wherein the second source of capacitance includes first conductor electrically connected to the first conductive layer, and a second conductor electrically connected to the second conductive layer; and electrically connecting a third capacitor to the parallel plate capacitor, wherein the third capacitor is an off-chip capacitor with a third conductor electrically connected to the first conductive layer, and a fourth conductor electrically connected to the second conductive layer, wherein the second capacitor comprises one or more discrete capacitors, and the third capacitor comprises one or more self-aligned via capacitors embedded within a second layer of the package.

11. A method for fabricating a hybrid capacitor configuration within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer;

fabricating a second layer of the package within which a set of self-aligned via capacitors is embedded, each of the self-aligned via capacitors having an inner conductor and an outer conductor;

electrically connecting the inner conductor to the first conductive layer; and electrically connecting the outer conductor to the second conductive layer.

12. The method as claimed in claim 11, wherein fabricating the second layer of the package comprises:

forming the outer conductor by plating sidewalls and at least a portion of a top surface of a substrate with a layer of conductive material, wherein the substrate includes one or more holes defined by the sidewalls;

forming a dielectric layer within the one or more holes on at least a portion of the outer conductor that covers the sidewalls; and forming an inner conductor within the one or more holes by depositing a conductive material within an area within the one or more holes that is not filled by the dielectric layer.

13. The method as claimed in claim 11, further comprising:

forming contacts to a surface of the integrated circuit package, wherein at least one of the contacts electrically connects the first conductive layer to the surface, and at least one other of the contacts electrically connects the second conductive layer to the surface; and electrically connecting one or more discrete capacitors to the contacts.

14. A method for fabricating a hybrid capacitor configuration within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer;

forming contacts to a surface of the integrated circuit package, wherein at least one of the contacts electrically connects the first conductive layer to the surface, and at least one other of the contacts electrically connects the second conductive layer to the surface; and electrically connecting one or more discrete capacitors to the contacts.

15. The method as claimed in claim 14, wherein forming the contacts comprises forming the contacts around a perimeter of an area where an integrated circuit will be electrically connected to the package.

16. A method for fabricating a hybrid capacitor configuration within an integrated circuit package, the method comprising:

fabricating a parallel plate capacitor embedded within a first layer of the package, wherein the parallel plate capacitor includes a first conductive layer, a second conductive layer, and a dielectric layer that electrically isolates the first conductive layer from the second conductive layer;

forming contacts to a surface of the integrated circuit package, wherein at least one of the contacts electrically connects the first conductive layer to the surface, and at least one other of the contacts electrically connects the second conductive layer to the surface;

electrically connecting one or more discrete capacitors to the contacts;

fabricating a second layer of the package within which a set of self-aligned via capacitors is embedded, each of the self-aligned via capacitors having an inner conductor and an outer conductor;

electrically connecting the inner conductor to the first conductive layer; and electrically connecting the outer conductor to the second conductive layer.

* * * * *

UNITED STATES PATENT AND TRADEMARK OFFICE
CERTIFICATE OF CORRECTION

PATENT NO. : 6,446,317 B1
DATED : September 10, 2002
INVENTOR(S) : David G. Figuero, Yuan-Liang Li and Huong T. Do It is certified that error appears in the above-identified patent and that said Letters Patent is hereby corrected as shown below:

Title page,
Item [54], Title, delete "HYBRID CAPACITOR METHOD OF FABRICATION THEREFOR", and insert -- HYBRID CAPACITOR FABRICATION METHOD --, therefor.
Item [74], *Attorney, Agent, or Firm*, insert -- , -- after "Kluth".

Column 8,
Line 35, delete "(Ta2O5)" and insert -- ($Ta_2O_5$) --, therefor.

Column 9,
Line 8, delete "(SrTiO3)" and insert -- ($SrTiO_3$) --, therefor.
Line 8, delete "(BaTiO3)" and insert -- ($BaTiO_3$) --, therefor.
Line 9, delete "(BaSrTiO3;BST)" and insert -- ($BaSrTiO_3$;BST), therefor.
Line 10, delete "(PbZrTiO3; PZT)" and insert -- ($PbZrTiO_3$; PZT) --. Therefor.
Line 10, delete "(A12O3)" and insert -- ($Al_2O_3$) --, therefor.
Line 11, delete "(Zr2O3)" and insert -- ($Zr_2O_3$) --, therefor.
Line 14, delete "(SiO2)" and insert -- ($SiO_2$) --, therefor.
Line 15, delete "(SiOxNy)" and insert -- ($SiO_xN_y$) --, therefor.

Signed and Sealed this

Tenth Day of August, 2004

JON W. DUDAS
*Acting Director of the United States Patent and Trademark Office*